United States Patent
Hamada

[11] Patent Number: 5,995,647
[45] Date of Patent: *Nov. 30, 1999

[54] METHOD OF PRODUCING CLEAR POTENTIAL CONTRAST IMAGE THROUGH SCANNING WITH ELECTRON BEAM FOR DIAGNOSIS OF SEMICONDUCTOR DEVICE AND ELECTRON BEAM TESTING SYSTEM USED THEREIN

[75] Inventor: Hiroyuki Hamada, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/782,099

[22] Filed: Jan. 13, 1997

[30] Foreign Application Priority Data

Jan. 12, 1996 [JP] Japan .................................. 8-021775

[51] Int. Cl.⁶ .......................... G06K 9/00; G01N 23/00; G01R 31/305
[52] U.S. Cl. ......................... 382/145; 324/751; 250/310
[58] Field of Search ................... 382/145, 144, 382/147, 270, 149; 250/310, 311, 305, 398, 397, 309, 307, 396 R; 324/751, 158.1, 501

[56] References Cited

U.S. PATENT DOCUMENTS 4,996,659  2/1991  Yamaguchi et al. ................. 364/579
5,521,517  5/1996  Shida et al. .......................... 250/310
5,528,156  6/1996  Ueda et al. .......................... 324/751

FOREIGN PATENT DOCUMENTS 0652444   5/1995  European Pat. Off. ...... G01R 31/307
59-099731 6/1984  Japan .............................. H01L 21/66
62-52841  3/1987  Japan .............................. H01J 37/28

OTHER PUBLICATIONS

*Patent Abstracts of Japan*, vol. 008, No. 213(E–269), Sep. 28, 1984, referencing JP 59099731, Jun. 8, 1984.

*Patent Abstracts of Japan*, vol. 95, No. 007, Aug. 31, 1995, referencing JP 07092238, Apr. 7, 1995.

"10.4. Design for Electron Beam Testability and Specimen Preparation", T.J. Alon et al., *Electron Beam Testing Technology*, 1993, pp. 410–415.

*Primary Examiner*—Thomas D Lee
*Assistant Examiner*—Wenpeng Chen
*Attorney, Agent, or Firm*—Sughrue, Mion, Zinn, Macpeak & Seas, PLLC

[57] ABSTRACT

An electron pulse signal is repeatedly radiated on a target spot applied with a certain potential for measuring a variation of secondary electron intensity, and a discrete value is assigned to each variation between the two secondary electron intensities so as to eliminate an electrical influence of an insulating passivation layer over the target spot from a potential contrast image.

8 Claims, 8 Drawing Sheets

METHOD OF PRODUCING CLEAR POTENTIAL CONTRAST IMAGE THROUGH SCANNING WITH ELECTRON BEAM FOR DIAGNOSIS OF SEMICONDUCTOR DEVICE AND ELECTRON BEAM TESTING SYSTEM USED THEREIN

FIELD OF THE INVENTION

This invention relates to a potential contrast image producing technology for a semiconductor device and, more particularly, to a method of producing a clear potential contrast image through scanning with an electron beam for diagnosing a semiconductor device and an electron beam test system used in the diagnosing method.

DESCRIPTION OF THE RELATED ART

When a manufacturer completes a semiconductor device, the manufacturer diagnoses the semiconductor device through various tests. One of the tests is carried out to see whether or not there are errors in the wirings of the semiconductor device. An electron beam testing system is used for the test. The electron beam testing system is equipped with an electron gun, and applies a potential to the wirings of the semiconductor device covered with a passivation layer. When the electron gun radiates an electron beam through the passivation layer to a selected spot on the wirings, secondary electron is emitted from the spot, and the intensity of the secondary electron is dependent on the potential level at the spot. While the electron gun is sweeping the surface of the passivation layer of the semiconductor device, the electron beam testing system measures the intensity of secondary electron, and forms a potential contrast from the secondary electron. The potential contrast represents the location of the wirings applied with the potential, and a disconnection is, by way of example, determined by comparing the potential contrast with the layout of the wirings. If the electron beam is radiated to selected spots in synchronization with the device function, an analyst can determine variation of the potential level at the selected spots during the operation.

However, the prior art method hardly obtains an accurate potential contrast image from the secondary electron. In detail, FIG. 1 illustrates the prior art electron beam testing system, and the prior art electron beam testing system comprises a test pattern generator $1a$ for applying a test pattern signal to pads $2a$ of a semiconductor device $2$, an electron gun $1b$ for radiating an electron pulse signal $3a$ over a passivation layer $2b$ and a secondary electron detector $1c$ for detecting a secondary electron $3b$. The electron pulse signal $3a$ passes through a passivation layer $2b$, and causes wirings $2c$, $2d$ and $2e$ to generate the secondary electron $3b$. The secondary electron detector $1c$ measures the intensity of secondary electron $3b$, and produces a data signal S1 representative of the intensity of secondary electron at each radiated spot.

The prior art electron beam testing system further comprises a video memory $1d$ for storing data information representative of a distribution of the intensity of secondary electron beam, a display driver $1e$ for generating a video signal representative of the distribution, a controller $1f$ for controlling a testing operation and a display unit $1g$ for producing a potential contrast image on a screen $1h$. The controller $1f$ specifies a test pattern to be applied to the pads $2a$ to the test pattern generator $1a$, and causes the secondary electron detector $1c$ to measure the intensity of secondary electron through the radiation of the electron pulse signal $3a$.

The controller $1f$ further addresses memory locations of the video memory $1d$ for the data signal S1, and the variation of secondary electron intensity is memorized in the video memory $1d$. The display driver $1e$ sequentially reads out the potential information from the video memory $1d$, and forms a potential contrast image on the screen $1h$.

While the electron gun $b$ is sweeping the passivation layer $2b$ with the electron pulse signal $3a$, the test pattern generator $1a$ supplies the pads $2a$ a test pattern which changes the wiring $2d$ to a high level at time t1 (see FIG. 2). If the electron pulse signal $3a$ is radiated to the wiring $2d$ at time t2, the secondary electron $3b$ is produced, and the secondary electron detector $1c$ measures the intensity of the secondary electron $3b$. The data signal S1 is supplied to the video memory $1d$, and the potential information representative of the intensity of the secondary electron $3b$ from the wiring $2d$ is written into the video memory $1d$. When the electron gun $1b$ completes the sweeping over the passivation layer $2b$, the display driver $1e$ reads out the potential information from the video memory $1d$, and forms a potential contrast image on the screen $1h$.

However, the wirings $2c$ to $2e$ have an electrical influence on the passivation layer $2b$, and charges the passivation layer $2b$. The potential level on the passivation layer $2b$ is varied together with the potential level on the wirings $2c$ to $2e$, and the potential level on the passivation layer $2b$ affects the secondary electron $3b$. For this reason, even if the test pattern generator $1a$ removes the potential from the wiring $2d$ at time t4, the intensity of the secondary electron $3b$ does not follow the potential level on the wiring $2d$. The secondary electron $3b$ step-wise decreases the potential level from time t3 to time t5. The data signal S1 is hardly produced from the intensity of secondary electron $3b$ immediately after the radiation of the electron pulse signal $3a$ at time t2, and is produced from the intensity of secondary electron $3b$ after the change at time t3. For this reason, the potential contrast image does not accurately reflect the actual potential difference between the wiring $2d$ and the circumference.

One solution is proposed in Japanese Patent Publication of Unexamined Application (Kokai) No. 62-52841. The prior art electron beam testing system disclosed in the Japanese Patent Publication of Unexamined Application radiates an electron beam to a semiconductor device, and periodically samples the intensity of a secondary electron generated at each sampling spot of the semiconductor device. The prior art electron beam testing system calculates a time constant from the sampled secondary beam intensity, and produces a potential contrast image on the screen. The potential contrast image is represented by using a variation of illuminance or a variation of tint. The time constant is dependent on the potential level at the sampling spot, and the influence of the passivation layer is eliminated from the secondary beam intensity.

However, the potential contrast image is less clear, because the contour lines are hardly discriminated therefrom. This is because of the fact that the potential contrast image is represented by a variation of illuminance or tint.

SUMMARY OF THE INVENTION

It is therefore an important object of the present invention to provide a method of producing a clear potential contrast image from which contour lines are clearly discriminated.

It is also another important object of the present invention to provide an electron beam testing system which is used in the method of producing a clear potential contrast image.

To accomplish the object, the present invention proposes to selectively assign discrete values to electron beam radiating spots.

In accordance with one aspect of the present invention, there is provided a method of producing a potential contrast image on a screen, comprising the steps of: a) determining electron beam radiating spots of an object covered with an insulating layer; b) measuring an intensity of secondary electron emitted from each of the electron beam radiating spots under an application of bias voltage during a radiation of an electron pulse signal thereto; c) repeating the step b) for measuring another intensity of secondary electron; d) determining a difference between the intensity of secondary electron and the aforesaid another intensity of secondary electron; e) comparing the difference with at least one threshold so as to assign a discrete value changed at the at least one threshold to the aforesaid each of the electron beam radiating spots; f) producing a potential contrast between the plurality of electron beam radiating spots from the discrete value at each of the plurality of electron beam radiating spots; and g) producing the potential contrast image representative of the potential contrast.

In accordance with another aspect of the present invention, there is provided an electron beam testing system for diagnosing a semiconductor device having a plurality of electron beam radiating spots covered with an insulating layer, comprising: a radiating unit for repeatedly radiating an electronic pulse signal through the insulating layer to the plurality of electron beam radiating spots; a biasing unit for selectively biasing the plurality of electron beam radiating spots; a secondary electron detector measuring an intensity of secondary electrons emitted from each of the plurality of electron beam radiating spots during a radiation of the electron pulse signal; an intensity data storage having a plurality of memory locations respectively assigned to the plurality of electron beam radiating spots for producing a distribution of secondary electron intensity from the intensities of secondary electron emitted from the plurality of electron beam radiating spots; a data processing unit assigning one of a plurality of discrete values to each of the plurality of electron beam radiating spots in dependence on the magnitude of a difference between the intensity of secondary electron measured during a radiation of the electron pulse signal and another intensity of secondary electron measured during a previous radiation of the electron pulse signal for producing a potential contrast between the plurality of electron beam radiating spots; and an image producing sub-system for producing a potential contrast image representative of the potential contrast.

BRIEF DESCRIPTION OF THE DRAWINGS

The features and advantages of the method and the electron beam testing system according to the present invention will be more clearly understood from the following description taken in conjunction with the accompanying drawings in which.

DESCRIPTION OF THE PREFERRED EMBODIMENT

Electron Beam Testing System

Figure 1:
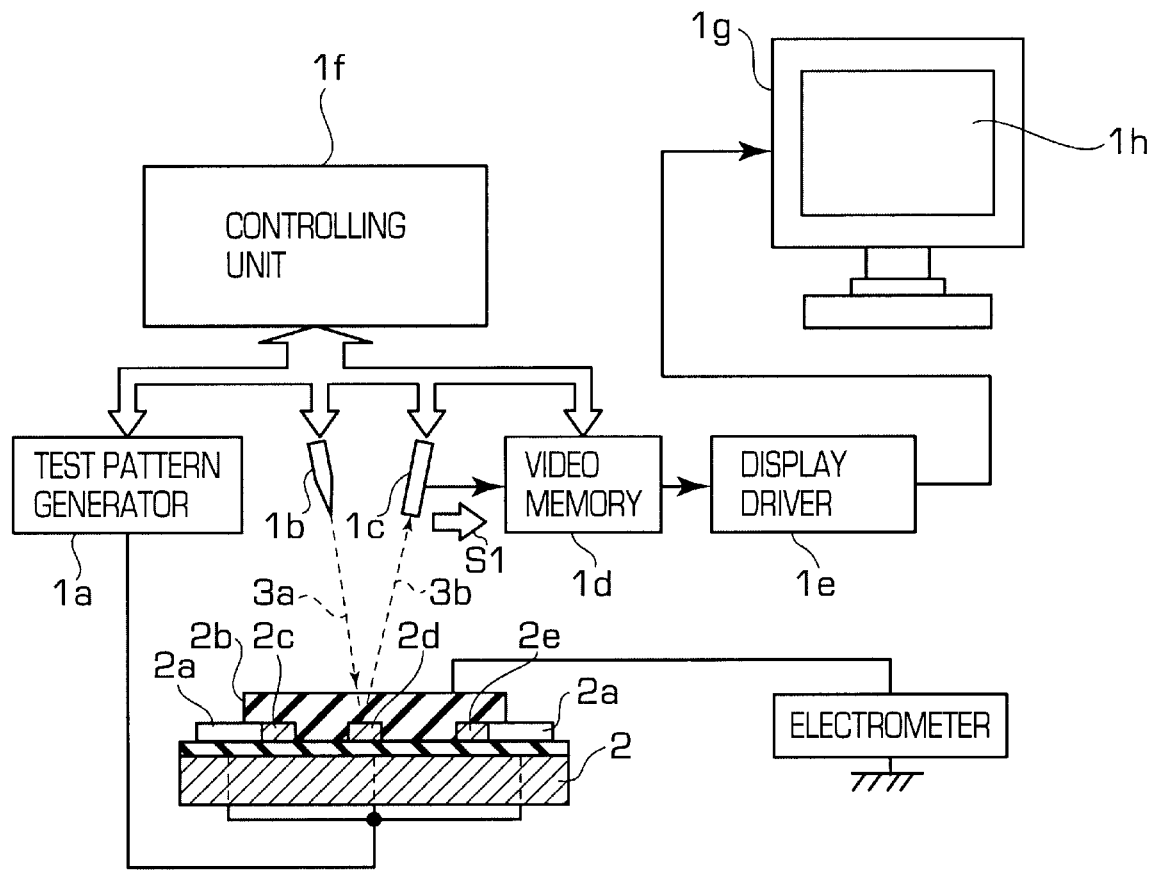
FIG. 1 is a schematic view showing the prior art electron beam testing apparatus.
Figure 2:
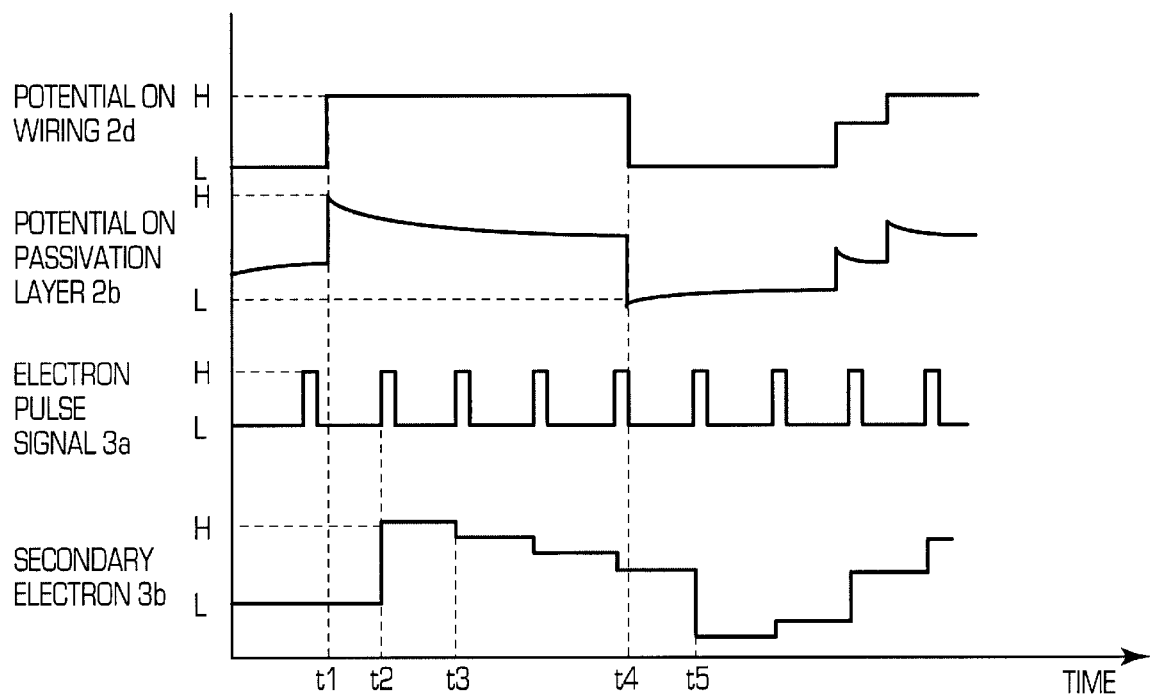
FIG. 2 is a diagram showing the waveforms of essential signals produced in the prior art electron beam testing apparatus.
Figure 3:
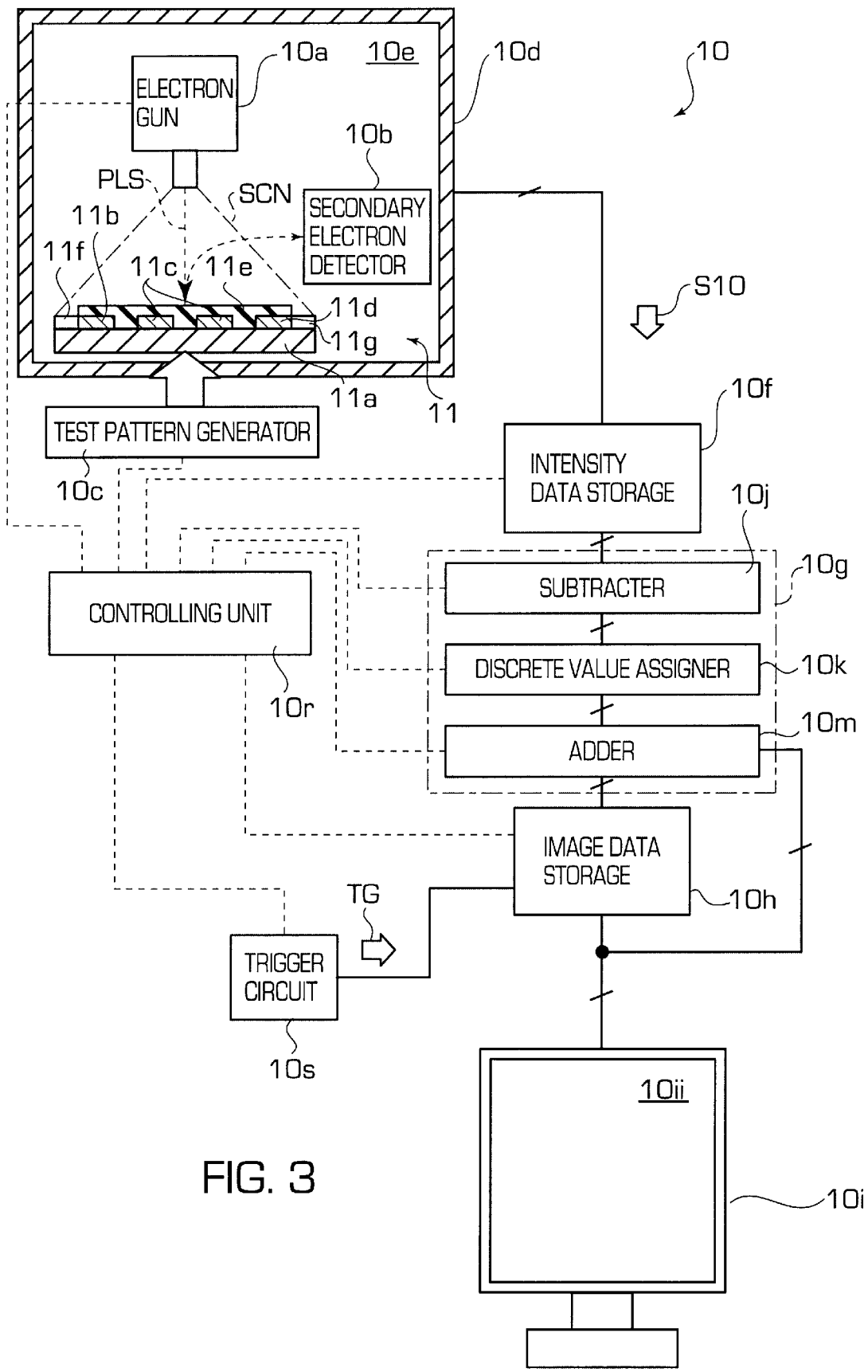
FIG. 3 is a schematic view showing an electron beam testing system according to the present invention.

Referring to FIG. 3 of the drawings, an electron beam testing system 10 embodying the present invention is provided for a semiconductor device 11. The semiconductor device 11 is fabricated on a semiconductor substrate 11a, and conductive wirings 11b, 11c and 11d are patterned over the major surface of the semiconductor substrate 11a. An insulating passivation layer 11e is formed on the semiconductor substrate 11a, and the wirings 11c to 11d are covered with the insulating passivation layer 11e. The wirings 11b to 11d are selectively connected to pads 11f and 11g uncovered with the insulating passivation layer 111e. Though not shown in FIG. 3, the semiconductor device 11 further has circuit components such as transistors, and the circuit components and the wirings 11b to 11d form an integrated circuit.

The electron beam testing system 10 comprises an electron gun 10a, a secondary electron detector 10b, a test pattern generator 10c and a vessel 10d defining a vacuum chamber 10e. The electron gun, the secondary electron detector 10b and the semiconductor device 11 are accommodated in the vacuum chamber 10e.

The electron gun 10a radiates an electron pulse signal PLS, and can sweep the entire surface of the semiconductor device 11 with the electron pulse signal PLS. If a plurality of electron beam radiating spots are selected from the entire surface of the semiconductor device, the electron gun 10a sequentially scans the electron beam radiating spots with the electron pulse signal PLS, and the sequential radiation to the spots is hereinbelow referred to as "scanning cycle". The electron beam radiating spots may be specified on the wirings 11b, 11c and 11d.

The secondary electron detector 10b detects secondary electron emitted from the semiconductor device 11, and measures the intensity of secondary electron. The secondary electron detector 10b produces a data signal S10 representative of the intensity of secondary electron at each electron beam radiating spot.

The test pattern generator 10c is connected to the pads 11f and 11g, and supplies a test pattern to the pads 11f/11g. Thus, the test pattern generator 10c selectively applies a potential level through the pads 11f/11g to the wirings 11b to 11d. The intensity of secondary electron is variable together with the potential level of the electron beam radiating spots.

The electron beam testing system 10 further comprises an intensity data storage 10f, a data processing unit 10g, an image data storage 10h and a display unit 10i. The intensity data storage 10f and the image data storage 10g are hereinlater detailed with reference to FIG. 4.

The data processing unit 10g includes a subtracter 10j, a discrete value assigner 10k and an adder 10m. These circuits 10j to 10m may be implemented by wired logic circuits or a microprocessor plus a suitable software. The subtracter 10j and the adder 10m are well known to a person skilled in the art, and no further description is incorporated hereinbelow. The discrete value assigner 10k compares a difference in secondary electron intensity at each electron beam radiating spot with a plurality of thresholds, and assigns one of discrete values to the electron beam radiating spot.

Figure 4:
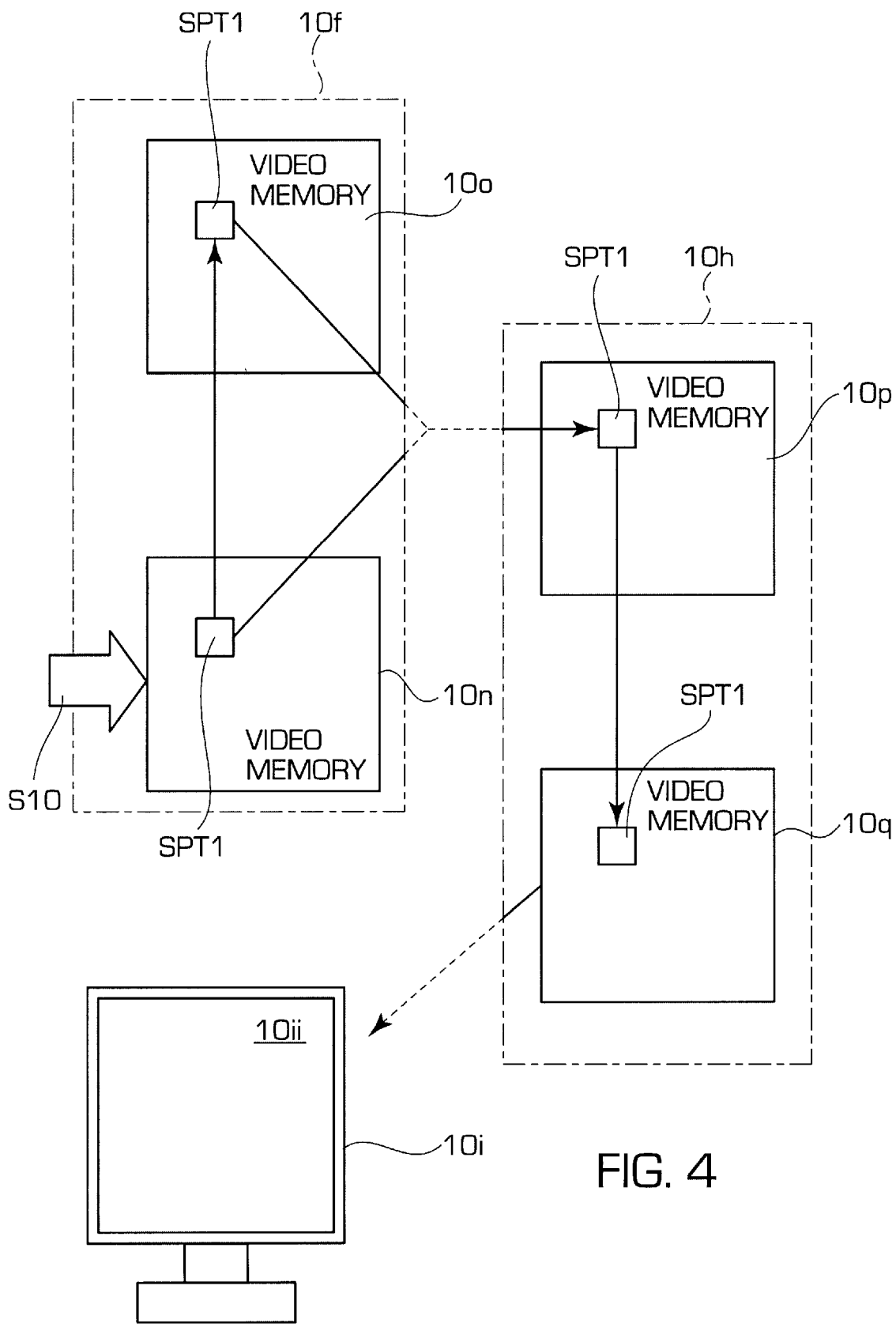
FIG. 4 is a block diagram showing a data transfer between video memories incorporated in the electron beam testing system.

Turning to FIG. 4 of the drawings, the intensity data storage 10f and the image data storage 10h includes video memories 10n and 10o and video memories 10p and 10q, respectively. The video memory 10n has a plurality of memory locations respectively assigned to the pixels on a screen 10ii of the display unit 10i, and the pixels covers a scanning area SCN (see FIG. 3). For this reason, certain memory locations are assigned to the electron beam radiating spots in the scanning area SCN. The other video memory 10q also has a plurality of memory locations respectively corresponding to the memory locations of the video memory 10n, and the electron beam scanning spots are also corresponds to selected memory locations. The intensity of secondary electron is represented by one of two hundred fifty-six grades.

The digital data signal S10 carries the intensity of secondary electron at each electron beam radiating spot to the video memory 10n, and is written into a group of the certain memory locations of the video memory 10n. While the electron gun 10a is sequentially radiating the electron pulse signal PLS to the electron beam radiating spots during one scanning cycle, the digital data signal S10 writes a distribution of secondary electron intensity to the video memory 10n, and are stored in the certain memory locations of the video memory 10n assigned to the electron beam radiating spots. Upon completion of the scanning cycle, the electron gun 10a repeats the scanning cycle, and the secondary electron detector 10b supplies the digital data signal S10 representative of a new distribution of the secondary electron intensity to the video memory 10n. Then, the previous distribution of secondary electron intensity is transferred from the certain memory locations of the video memory 10n to the corresponding memory locations of the video memory 10o, and the new distribution of secondary electron intensity is stored in the certain memory locations of the video memory 10n.

A group of memory location indicated by a square is assumed to be assigned to an electron beam radiating spot SPT1, and has already stored an intensity of secondary electron supplied thereto during the previous scanning cycle. The electron gun 10a repeats the scanning cycle, and the digital data signal S10 carries a new intensity of secondary electron at the electron beam radiating spot SPT to the video memory 10n. The previous intensity of secondary electron is firstly transferred to the group of memory locations of the video memory 10o assigned to the electron beam radiating spot SPT, and, thereafter, the new intensity is stored into the group of certain memory location of the video memory 10n. Thus, the memory locations of the video memory 10n are corresponding to the memory locations of the video memory 10o, and the intensity data storage 10f stores two distributions of secondary electron intensity obtained through two scanning cycles. If the semiconductor device 11 is operating on a given test pattern, the potential on the wirings 11b to 11d are varied with time, and the distributions of secondary electron intensity are sequentially renewed with time.

As described hereinbefore, the data processing unit 10g accesses the groups of certain memory locations and the groups of selected memory locations corresponding thereto, and selectively assigns the discrete values to the electron beam radiating spots. The discrete value represents one of the two hundred fifty-six grades.

The video memory 10p also has a plurality of memory locations corresponding to the memory locations of the video memory 10n, and the discrete values are stored in the memory locations corresponding to the groups of certain memory locations. A discrete value for the electron beam radiating spot STP1 is stored in the group of memory locations corresponding to the group of certain memory locations of the video memory 10n also assigned to the electron beam radiating spot SPT1. The data stored in the video memory 10p is representative of a potential contrast over the scanning area SCN. If the semiconductor device is operating on the given test pattern, the potential contrast is also varied with time.

The video memory 10q also has a plurality of memory locations corresponding to the memory locations of the video memory 10q and, accordingly, the memory locations of the video memory 10n. If the semiconductor device is operating on the given test pattern, the potential contrast is periodically transferred from the video memory 10p to the video memory 10q, and the display unit 10i forms a potential contrast image varied with time on the screen 10ii from the potential contrast.

Turning back to FIG. 3 of the drawings, the electron beam testing system 10 further comprises a controlling unit 10r for controlling the electron beam testing operation and a trigger circuit 10s. The trigger circuit 10s supplies a trigger signal TG to the image data storage 10h, and the trigger signal TG causes the video memory 10p to transfer the potential contrast to the video memory 10q during the active level thereof. Using the trigger signal TG, an analyst can confirm a potential contrast at a certain timing during the operation of the semiconductor device 11.

Method of Producing Potential Contrast Image

Figure 5A:
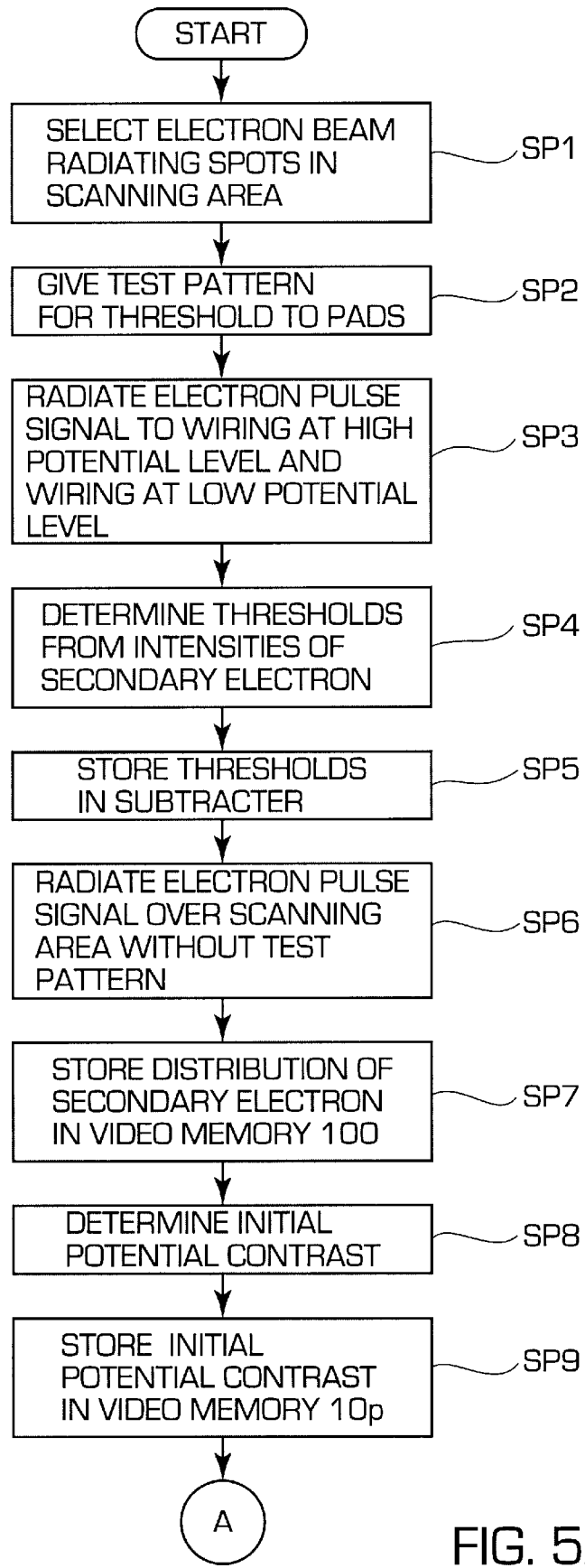
FIGS. 5A to 5C are flow charts showing a method of producing a potential contrast image on a screen according to the present invention.
Figure 5B:
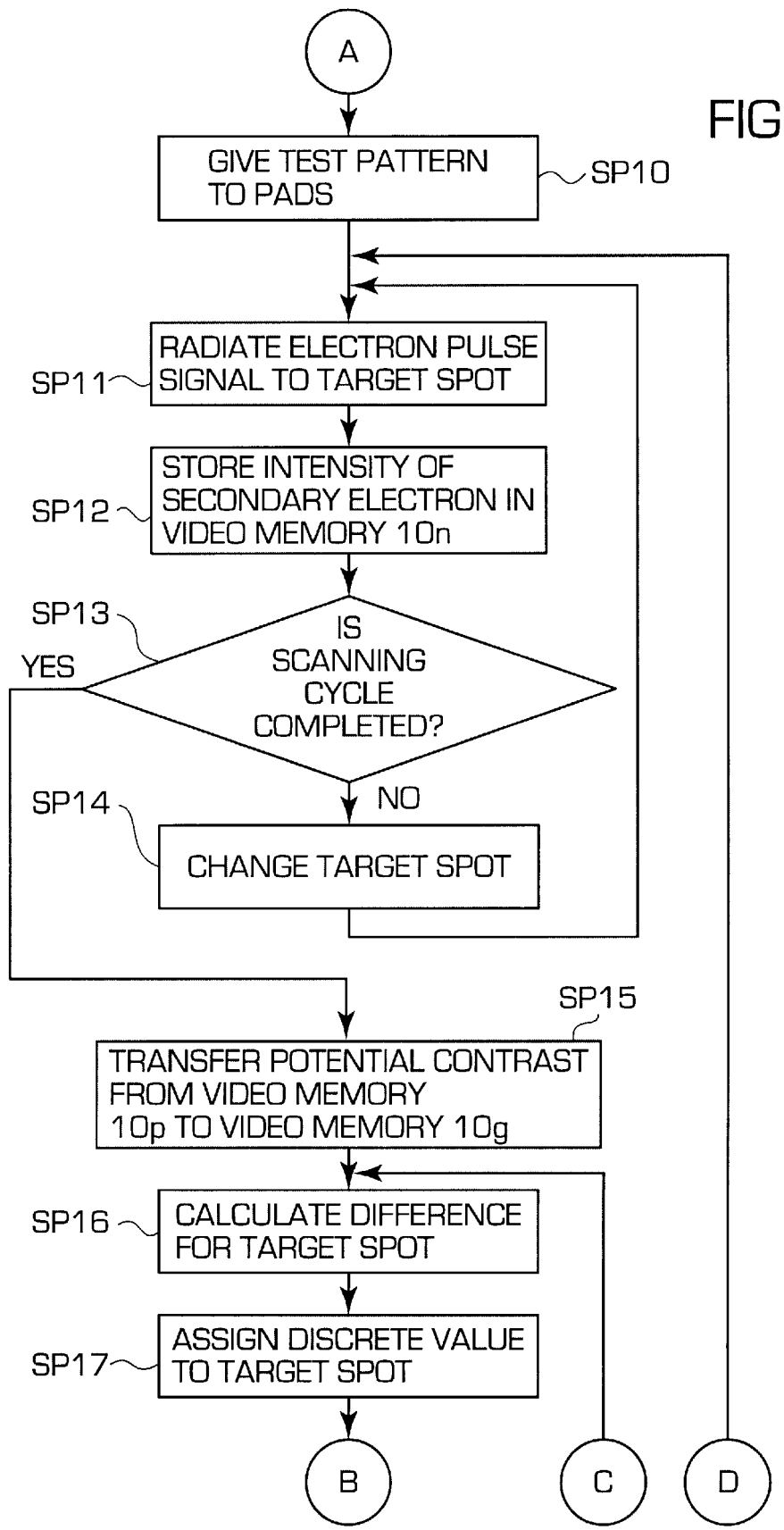
Figure 5C:
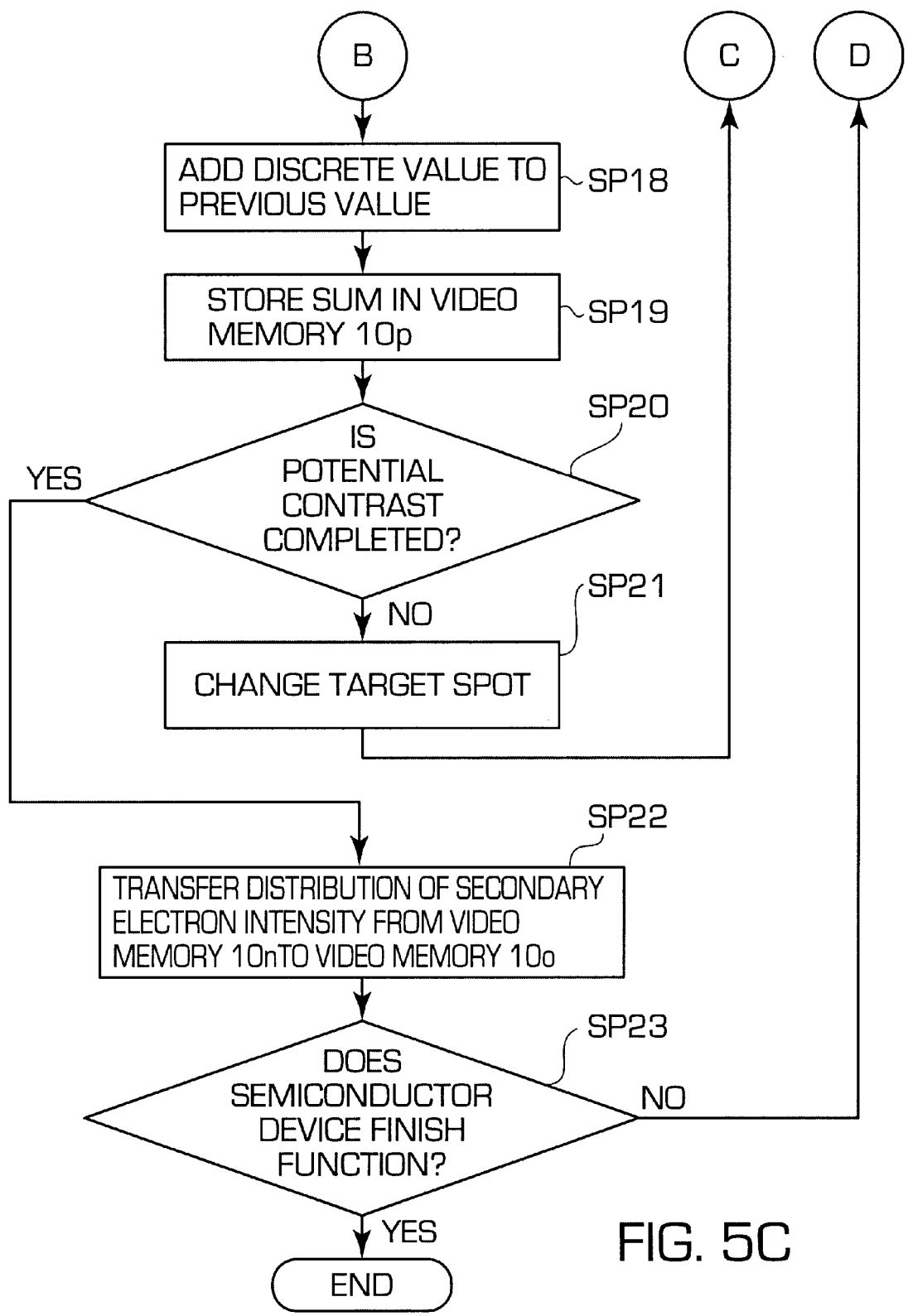
Figure 6:
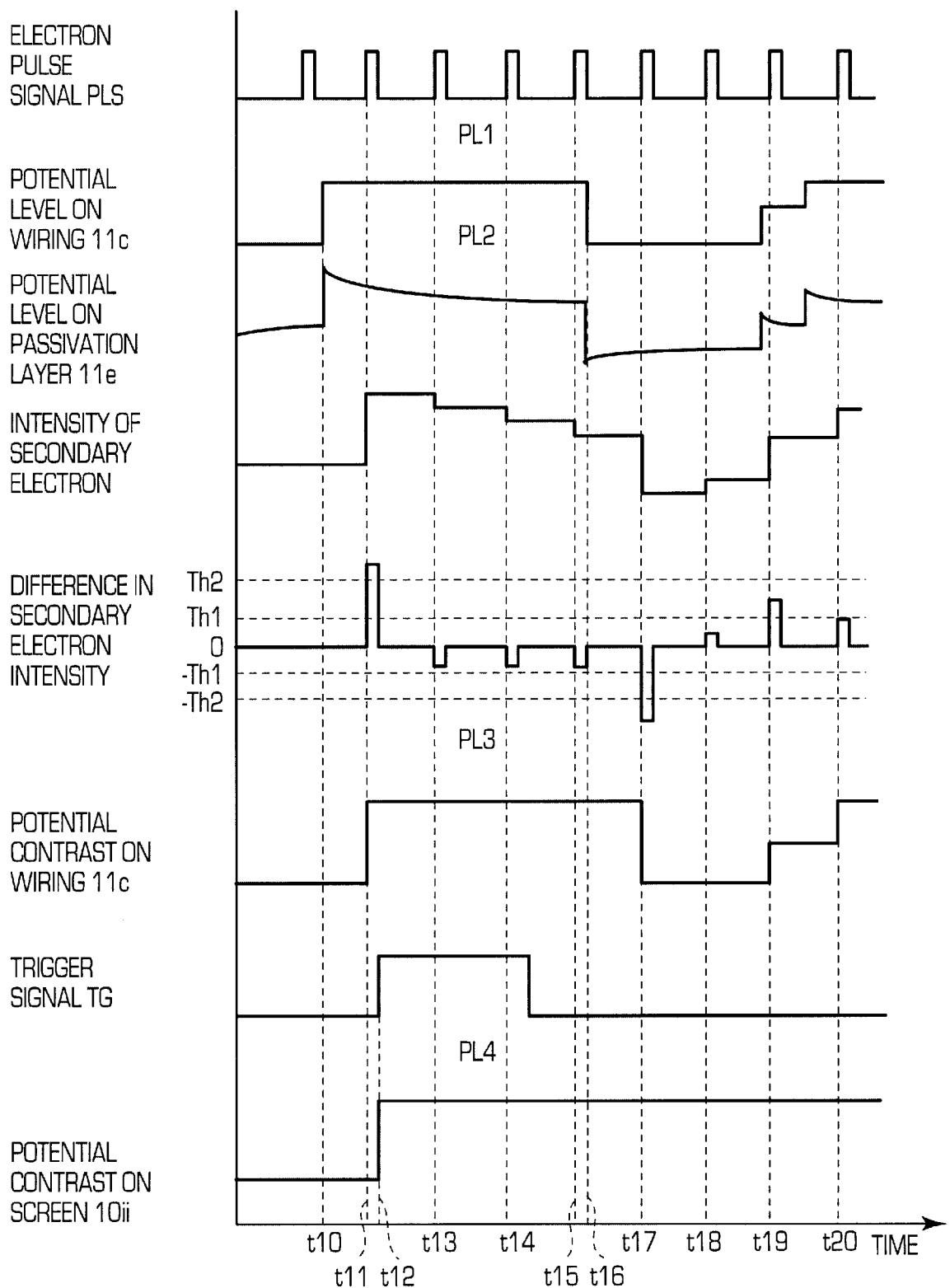
FIG. 6 is a diagram showing the waveforms of essential signals produced in the electron beam testing system.

FIGS. 5A to 5C illustrate a method of producing a potential contrast image according to the present invention. FIG. 6 focuses the method on the wiring 11c, and shows the waveforms of essential signals produced in the electron beam testing system 10.

The method starts with selection of the electron beam radiating spots on the semiconductor device 11 as by step SP1. The electron beam radiating spots are selected in such a manner that an analyst wants to know potential levels thereat, and are usually over the wirings 11b to 11d.

Subsequently, the test pattern generator 10c applies a test pattern so as to charge some wirings to a high potential level and maintain other wirings at a low potential level as by step SP2, and the electron gun 10a radiates a high-frequency electron pulse signal to the wiring at the high potential level and the wiring at the low potential level as by step SP3. The high-frequency electron pulse signal is so high in frequency that the insulating passivation layer 11e hardly accumulates the electric charge. The high-frequency electron pulse signal is radiated to spots of the selected wirings such as 11b and 11d adjacent to the pads 11f/11g, because no potential drop takes place. The spots may be specified by the analyst through a mouse (not shown) or automatically selected from a potential contrast.

The spots emit the secondary electron, and the intensities a and b of secondary electron are measured by the secondary electron detector 10b. The controlling unit 10r calculates thresholds Th1 and Th2 from the intensity a of secondary electron emitted from the wiring at the high potential level and the intensity b of secondary electron emitted from the wiring at the low potential level as by step SP4.

$$Th1=(b-a)/3 \qquad \text{Equation 1}$$

$$Th2=2\times(b-a)/3 \qquad \text{Equation 2}$$

The controlling unit 10r transfers the thresholds Th1 and Th2 to the discrete value assigner 10k as by step SP5.

Subsequently, the test pattern generator 10c removes the test pattern from the semiconductor device 11, and no potential bias is applied to all of the wirings 11b to 11d. The electron gun 10a radiates the electron pulse signal PLS over the scanning area SCN as by step SP6, and the secondary electron detector 10b measures the intensity of secondary electron. The intensity of secondary electron is varied depending upon the radiated spot, and the data signal S10 is supplied to the video memory 10n so as to store the intensity of secondary electron at every radiated spot in the scanning area SCN therein. Upon completion of the scanning, an initial distribution of secondary electron intensity is stored in the video memory 10n, and is transferred from the video memory 10n to the video memory 10o as by step SP7. The initial distribution of secondary electron intensity is further transferred to the data processing unit 10g, and the data processing unit 10g determines an initial potential contrast as by step SP8. The initial potential contrast is transferred to the video memory 10p, and is stored therein as by step SP9. The initial potential contrast may be further transferred to the video memory 10q so as to produce an initial potential contrast image on the screen 10ii.

Subsequently, the test pattern generator 10c gives a test pattern to the pads 11f/11g so that the semiconductor device starts a function as by step SP10. The electron gun 10a radiates the electron pulse signal PLS to a target spot selected from the electron beam radiating spots as by step SP11. The target spot emits the secondary electron, and the secondary electron detector 10b measures the intensity of secondary electron. The secondary electron detector 10b supplies the data signal S10 to the video memory 10n, and the intensity of secondary electron is stored in the certain memory locations assigned to the target spot as by step SP12.

The controlling unit 10r confirms whether or not all of the electron beam radiating spots are scanned as by step SP13. If the answer at step SP13 is given negative, the target spot is changed to another electron beam radiating spot as by step SP14, and the electron beam testing system 10 returns to step SP11. Thus, the electron beam testing system 10 sequentially scans the electron beam radiating spots with the electron pulse signal PLS, and forms a distribution of secondary electron intensity in the video memory 10n through the loop consisting of steps SP11 to SP14.

When the electron beam testing system 10 completes the scanning cycle for all the electron beam radiating spots, the answer at step SP13 is changed to affirmative, and the electron beam testing system 10 proceeds to step SP15 so as to transfer the potential contrast from the video memory 10p to the video memory 10q. The display unit 10i forms a potential contrast image on the screen 10ii from the potential contrast stored in the video memory 10q. Although time delay is introduced between the scanning cycle and the production of voltage contrast image, the time delay is extremely short, and is ignoreable during the analysis.

The initial distribution of secondary electron intensity and the distribution of secondary electron intensity acquired through the scanning have been already stored in the video memories 10n and 10o, respectively. The subtracter 10j calculates the difference in secondary electron intensity between the data stored in the video memories 10n and 10o for one the electron beam radiating spots as by step SP16. One of the electron beam radiating spots is referred to as "target spot" hereinbelow. The subtracter 10j transfers the difference in secondary electron intensity to the discrete value assigner 10k, and the discrete value assigner 10k assigns one of the threshold values to the target spot as by step SP17. The relation between the difference D and the discrete values is as follows.

If the difference D is equal to or less than the absolute value of threshold Th1, discrete value "0" is assigned to the target spot.

If the difference D is greater than the threshold Th1 and is equal to or less than the threshold Th2, discrete value (b−a)/2 is assigned to the target spot.

If the difference D is greater than the threshold Th2, discrete value (b−a) is assigned to the target spot.

If the difference D is less than the threshold −Th1 and equal to or greater than the threshold −Th2, discrete value −(b−a)/2 is assigned to the target spot.

If the difference D is less than the threshold −Th2, discrete value −(b−a) is assigned to the target spot.

The discrete value at the target spot is supplied to the adder 10m, and is added to the value stored in the memory location assigned to the target spot as by step SP18. The sum is restored in the memory location of the video memory 10q as by step SP19.

A variation due to the electrical influence of the insulating passivation layer 11e is so small that the discrete values are never affected by the variation, and the electrical influence of the insulating passivation layer 11e is eliminated from the potential contrast. On the other hand, the variation due to the test pattern is large enough to affect the discrete value. As a result, the potential contrast only represents the variation of secondary electron intensity due to the test pattern.

The controlling unit 10r confirms whether or not the potential contrast is created over the scanning area SCN or the discrete values have been assigned to all of the electron beam radiating spots as by step SP20. If the answer at step SP20 is given negative, the target spot is changed to another electron beam radiating spot, and the electron beam testing system 10 returns to step SP16. Thus, the electron beam testing system 10 repeats the loop consisting of steps SP16 to SP21 so as to assign the discrete values to all of the electron beam radiating spots.

When the discrete values are assigned to all of the electron beam radiating spots, a potential contrast is formed in the video memory 10p, and the answer at step SP20 is given affirmative. Then, the electron beam testing system 10 transfers the distribution of secondary electron from the video memory 10n to the video memory 10o, and proceeds to step SP23. The controlling unit 10r confirms whether or not the semiconductor device 11 finishes the function at step SP23. If the answer at step SP23 is given negative, the electron beam testing system 10 returns to step SP11, and repeats the loop consisting of steps SP11 to SP23 so as to renew the potential contrast over the scanning area SCN.

When the semiconductor device 11 finishes the function, the answer at step SP23 is changed to affirmative, and the electron beam testing system 10 terminates the sequence.

If the method according to the present invention is focused on the wiring 11c, the electron beam testing system 10 produces a potential contrast image for the wiring 11c on the screen 10ii as shown in FIG. 6. The test pattern generator 10c supplies a test pattern to the pad (not shown) connected to the wiring 10c at time t10, and the wiring 11c lifts the potential level to the high level. The test pattern generator 10c removes the test pattern from the semiconductor device 11 at time t16, and the potential level on the wiring 11c is represented by rectangular waveform PL1.

While the test pattern generator 10c is maintaining the potential level on the wiring 11c at the high level, the electron gun 10a radiates the electron pulse signal PLS at times t11, t13, t14 and t15 during the respective scanning cycles. The insulating passivation layer 11e is charged, and the potential level at time t10 reaches the maximum level. However, the potential level on the insulting passivation layer 11e is gradually decreased, and forms a non-rectangular waveform PL2.

The secondary electron detector 10b repeatedly measures the intensity of secondary electron in response to the electron pulse signal PLS at time t11, t13, t14, t15 and t17, and the intensity of secondary electron is stepwise decreased from time t11 to time t17 due to the electrical influence of the insulating passivation layer 11e.

As described hereinbefore, the subtracter 10j calculates the difference in secondary electron intensity between the intensity in the previous scanning cycle and the intensity in the current scanning cycle, and the differences D are compared with the thresholds Th2, Th2, −Th1 and −Th2. Although the potential differences D at time t11 and t17 are large, the potential differences D at times t13, t14 and t15 are small, and discrete value of "0" is assigned to the differences at time t13 to time t15. As a result, the potential contrast on the wiring 11c has a rectangular waveform PL3 similar to the waveform PL1, and the method according to the present invention is effective against the electrical influence of the insulating passivation layer 11e.

If the trigger circuit 10s supplies the trigger signal TG to the image data storage 10h at time t12, the video memory 10q keeps the potential contrast at time t12, and the display unit 10i continuously shows the potential contrast at time t12 as indicated by plots PL4.

As will be appreciated from the foregoing description, the method of producing a potential contrast image according to the present invention eliminates the undesirable electrical influence of the insulating passivation layer 11e from the potential contrast at the electron beam radiating spots, and produces a clear potential contrast image on a screen 10ii. The electron beam testing system shown in FIGS. 3 and 4 is operative in accordance with the method according to the present invention.

Although a particular embodiment of the present invention has been shown and described, it will be obvious to those skilled in the art that various changes and modifications may be made without departing from the spirit and scope of the present invention.

For example, every other variation of secondary electron intensity may be directly supplied from the secondary electron generator to the subtracter. In this instance, the data storage is decreased in capacity to a half of that of the previous embodiment.

In the above described embodiment, the subtracter calculates a difference in the intensity of secondary electron between two scanning cycles successively carried out. However, the difference may be calculated between the variation of secondary electron intensity obtained through a certain scanning cycle and the variation of secondary electron intensity obtained through a scanning cycle carried out more than one scanning cycle earlier than the certain scanning cycle.

Moreover, the method according to the present invention may discriminate a potential variation of a multi-layer wiring structure. A lower wiring of the multi-layer wiring structure rapidly decreases the intensity of secondary electron under the electrical influence of the insulating passivation layer, and the insulating passivation layer is less affected by the potential variation on the lower wiring. For this reason, the scanning cycle may be arranged so as to complete the scanning within a short time period, and the range between the thresholds may be narrow.

The threshold may be more than four thresholds, i.e, −Th2, −Th1, Th1 and Th2. The number of thresholds is dependent on the analysis and the object of the analysis, and only one threshold may be used in the analysis.

What is claimed is:

1. A method of producing a potential contrast image on a screen, comprising the steps of:

a) determining electron beam radiating spots of an object covered with an insulating layer;

b) measuring an intensity of secondary electrons emitted from each of said electron beam radiating spots under an application of bias voltage during a radiation of an electron pulse signal thereto;

c) repeating said step b) for measuring another intensity of secondary electrons, still under the application of said bias voltage;

d) determining a difference between said intensity of secondary electrons and said another intensity of secondary electrons;

e) comparing said difference with multiple thresholds so as to assign a discrete value changed at said multiple thresholds to said each of said electron beam radiating spots;

f) producing a potential contrast between said plurality of electron beam radiating spots from the discrete value at each of said plurality of electron beam radiating spots; and g) producing said potential contrast image representative of said potential contrast.

2. The method as set forth in claim 1, further comprising the step of measuring an initial distribution of secondary electron emitted from said object without an application of bias voltage during a radiation of said electron pulse signal over said insulating layer for producing an initial potential contrast between said step a) and said step b).

3. The method as set forth in claim 1, further comprising the step of storing said intensity of secondary electron in a memory between said step b) and said step c).

4. The method as set forth in claim 1, further comprising the step of repeating said steps c), d) e) and f) for renewing said potential contrast image.

5. The method as set forth in claim 4, in which said potential contrast image is produced at a timing specified by an analyst while said steps c) to f) are being repeated.

6. An electron beam testing system for diagnosing a semiconductor device having a plurality of electron beam radiating spots covered with an insulating layer, comprising:

a radiating unit for repeatedly radiating an electronic pulse signal through said insulating layer to said plurality of electron beam radiating spots;

a biasing unit for selectively biasing said plurality of electron beam radiating spots at a specific bias voltage;

a secondary electron detector measuring an intensity of secondary electrons emitted from each of said plurality of electron beam radiating spots during a radiation of said electron pulse signal at said specific bias voltage;

an intensity data storage having a plurality of memory locations respectively assigned to said plurality of electron beam radiating spots for producing a distribution of secondary electron intensity from the intensities of secondary electrons emitted from said plurality of electron beam radiating spots;

a data processing unit assigning one of a plurality of discrete values to each of said plurality of electron beam radiating spots in dependence on the magnitude of a difference between said secondary electron intensity and said intensity of secondary electrons measured at said specific bias voltage during a previous radiation of said electron pulse signal for producing a potential contrast between said plurality of electron beam radiating spots; and an image producing sub-system for producing a potential contrast image representative of said potential contrast, wherein said data processing unit assigns said discrete values by comparing said difference with multiple thresholds.

7. The electron beam testing apparatus as set forth in claim 6, in which said intensity data storage includes a first video memory for storing said distribution of secondary electron intensity and a second video memory for storing a previous distribution of secondary electron intensity produced during said previous radiation of said electron pulse signal to said plurality of electron beam radiating spots.

8. The electron beam testing system as set forth in claim 6, in which said data processing unit includes a subtracter connected to said intensity data storage and calculating said difference between said intensity and said another intensity for said each of said plurality of electron beam radiating spots, a discrete value assigner connected to said subtracter for assigning said one of said plurality of discrete values to said each of said plurality of electron beam radiating spots depending upon said magnitude of said difference, and an adder connected to said discrete value assigner and said image producing sub-system for renewing said potential contrast.

* * * * *